United States Patent
Kijima et al.

(10) Patent No.: US 9,831,417 B2
(45) Date of Patent: Nov. 28, 2017

(54) POLING TREATMENT METHOD, MAGNETIC FIELD POLING DEVICE, AND PIEZOELECTRIC FILM

(75) Inventors: Takeshi Kijima, Chiba (JP); Yuuji Honda, Chiba (JP); Tomoyuki Araki, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 353 days.

(21) Appl. No.: 14/350,864

(22) PCT Filed: Oct. 14, 2011

(86) PCT No.: PCT/JP2011/073624
§ 371 (c)(1),
(2), (4) Date: Jul. 11, 2014

(87) PCT Pub. No.: WO2013/054432
PCT Pub. Date: Apr. 18, 2013

(65) Prior Publication Data
US 2014/0319405 A1 Oct. 30, 2014

(51) Int. Cl.
*G02F 1/355* (2006.01)
*H01L 41/08* (2006.01)
(Continued)

(52) U.S. Cl.
CPC ........ *H01L 41/1876* (2013.01); *G02F 1/3558* (2013.01); *H01L 41/0805* (2013.01);
(Continued)

(58) Field of Classification Search
USPC ................................................ 310/357, 359
See application file for complete search history.

(56) References Cited

U.S. PATENT DOCUMENTS 4,089,034 A * 5/1978 Taylor .................. H01L 41/193
29/25.42
4,999,217 A * 3/1991 Watanabe .............. G11B 5/845
427/128
(Continued)

FOREIGN PATENT DOCUMENTS

JP 10-177194 6/1998
JP 2006225565 A * 8/2006
(Continued)

OTHER PUBLICATIONS

Vallerien et al, "Experimental Proof of Piezoelectricity in Cholesteric and Chiral Smectic C*-Phases of LC-Elastomers" (1990) Makromol. Chem., Rapid Commun. 11, pp. 593-598.*
(Continued)

*Primary Examiner* — Jeffrey Wollschlager
*Assistant Examiner* — Armand Melendez
(74) *Attorney, Agent, or Firm* — Wenderoth, Lind & Ponack, L.L.P.

(57) ABSTRACT

To perform poling treatment in a simple procedure by dry process. A magnetic field poling device includes a first holding part configured to hold a film-to-be-poled (2); a second holding part configured to hold a magnet generating a magnetic field B to the film-to-be-poled (2); and a moving mechanism configured to move the first holding part or the second holding part in a direction perpendicular to the direction of the magnetic field B.

5 Claims, 5 Drawing Sheets

(51) Int. Cl.
*H01L 41/187* (2006.01)
*H01L 41/257* (2013.01)
*H01L 41/314* (2013.01)

(52) U.S. Cl.
CPC .......... *H01L 41/257* (2013.01); *H01L 41/314* (2013.01); *Y10T 29/42* (2015.01)

(56) References Cited

U.S. PATENT DOCUMENTS

| | | | | |
|---|---|---|---|---|
| 5,916,641 | A | * | 6/1999 | McArdle .................. G03F 7/34 427/128 |
| 6,399,011 | B1 | * | 6/2002 | Staines ............... H01L 39/2419 264/427 |
| 2008/0246366 | A1 | | 10/2008 | Burgener et al. |
| 2009/0050949 | A1 | | 2/2009 | Maruyama et al. |
| 2009/0236949 | A1 | * | 9/2009 | Fujii ..................... C23C 14/088 310/367 |

FOREIGN PATENT DOCUMENTS

| | | | |
|---|---|---|---|
| JP | 2007-266407 | * | 10/2007 |
| JP | 2010-505385 | | 2/2010 |
| JP | 2010-219484 | * | 9/2010 |
| JP | 2010-254560 | | 11/2010 |
| JP | 2011-184289 | | 9/2011 |
| WO | 2007/110950 | | 10/2007 |

OTHER PUBLICATIONS

International Search Report dated Nov. 22, 2011 in International Application No. PCT/JP2011/073624.

* cited by examiner (A)

MAGNET FOR 90° POLING (B)

MAGNET FOR 180° POLING

POLING TREATMENT METHOD, MAGNETIC FIELD POLING DEVICE, AND PIEZOELECTRIC FILM

BACKGROUND OF THE INVENTION

1. Technical Field

The present invention relates to a poling treatment method, a magnetic field poling device, and a piezoelectric film.

2. Description of the Related Art

FIG. 9 is a schematic diagram illustrating a conventional poling device.

A crystal 33 is sandwiched in the center of a pair of electrodes 35 constituted by two parallel flat plates each having 10×10 mm$^2$ so that an electric field is applied in a direction not subjected to mechanical poling. In addition, the crystal 33 together with the electrodes 35 is immersed in an oil 36 of an oil bath 37, and the oil 36 in which the crystal 33 has been immersed is then heated to 125° C. by a heater 38. After having reached a specified temperature of the oil, a DC electric field of 1 kV/cm is applied between the electrodes 35 for 10 hours from a high-voltage power source 39 via lead wires 40. Therefore, the crystal 33 is subjected to the DC poling treatment (for example, refer to Japanese Patent Laid Open No. 10-177194 (see Paragraph 0018, FIG. 4)).

The above-described conventional poling treatment method is a wet process in which the material to be poled is immersed in oil in a state of being sandwiched in the center of a pair of electrodes, and thus the poling treatment becomes complicated.

SUMMARY OF THE INVENTION

1. Problems to be Solved by the Invention

An aspect of the present invention is to conduct poling treatment in a simple procedure through the use of a dry process.

Another aspect of the present invention is to enhance the characteristics of a piezoelectric film subjected to poling treatment.

2. Means for Solving the Problems

Various aspects of the present invention will be described below.
(1) A poling treatment method of a film-to-be-poled by using magnetism.
(2) The poling treatment method according to the above (1), including the step of, while generating a magnetic field to the film-to-be-poled, moving the film-to-be-poled in a direction perpendicular to and relative to the magnetic field.
(3) The poling treatment method according to the above (1) or (2), wherein the poling treatment is performed on a 90° domain perpendicular to the thickness direction of the film-to-be-poled, and the poling treatment on the 90° domain is performed by, while generating a magnetic field in a direction parallel to the film-thickness direction, moving the film-to-be-poled in a direction perpendicular to the film-thickness direction and relative to the magnetic field.
(4) The poling treatment method according to the above (3), wherein the poling treatment on the 90° domain is performed at the Curie temperature of the film-to-be-poled, or higher.
(5) The poling treatment method according to the above (3) or (4), wherein the poling treatment on the 90° domain is performed while cooling the film-to-be-poled from the Curie temperature or higher.
(6) The poling treatment method according to any one of the above (1) to (5), wherein the poling treatment is performed on a 180° domain in a direction parallel to the thickness direction of the film-to-be-poled, and the poling treatment on the 180° domain is performed by, while generating a magnetic field in a direction perpendicular to the film-thickness direction, moving the film-to-be-poled in a direction perpendicular to the film-thickness direction, in a direction perpendicular to the magnetic field, and relative to the magnetic field.
(7) The poling treatment method according to the above (6), wherein the poling treatment on the 180° domain is performed at the Curie temperature of the film-to-be-poled, or higher.
(8) The poling treatment method according to the above (6) or (7), wherein the poling treatment on the 180° domain is performed while cooling the film-to-be-poled from the Curie temperature or higher.
(9) The poling treatment method according to any one of the above (3) to (8), wherein move of the film-to-be-poled is to rotatably move the film-to-be-poled.
(10) The poling treatment method according to any one of the above (3) to (9), wherein the intensity of the magnetic field is larger than 1000 G/100 mT.
(11) The poling treatment method according to any one of the above (1) to (10), wherein the film-to-be-poled is formed on a substrate.
(12) A poling treatment method comprising the step of performing poling treatment on a 90° domain in a direction perpendicular to the thickness direction of a film-to-be-poled.
(13) The poling treatment method according to the above (12), wherein the poling treatment on the 90° domain is performed at the Curie temperature of the film-to-be-poled, or higher.
(14) The poling treatment method according to the above (12) or (13), wherein the poling treatment on the 90° domain is performed while cooling the film-to-be-poled from the Curie temperature or higher.
(15) The poling treatment method according to any one of the above (12) to (14), wherein the poling treatment is performed on a 180° domain of the film-to-be-poled in a direction parallel to the thickness direction thereof.
(16) The poling treatment method according to the above (15), wherein the poling treatment on the 180° domain is performed by forming plasma at a position facing the film-to-be-poled.
(17) The poling treatment method according to the above (16), wherein the DC voltage in forming a DC plasma at a position facing the film-to-be-poled or the DC voltage component in forming a high frequency plasma at a position facing the film-to-be-poled is in a range from ±50 V to ±2 kV.
(18) The poling treatment method according to the above (16) or (17), wherein the pressure in forming the plasma is in a range of 0.01 Pa to atmospheric pressure.
(19) The poling treatment method according to any one of the above (16) to (18), wherein the plasma-forming gas in forming the plasma is one or more gases selected from the group consisting of an inert gas, $H_2$, $N_2$, $O_2$, $F_2$, $C_xH_y$, $C_xF_y$, and air.

(20) The poling treatment method according to the above (15), wherein the poling treatment on the 180° domain is performed by, while generating a magnetic field in a direction perpendicular to the film-thickness direction, moving the film-to-be-poled in a direction perpendicular to the film-thickness direction, in a direction perpendicular to the magnetic field, and relative to the magnetic field.

(21) The poling treatment method according to any one of the above (12) to (20), wherein the poling treatment on the 90° domain is performed by, while generating a magnetic field in a direction parallel to the film-thickness direction, moving the film-to-be-poled in a direction perpendicular to the film-thickness direction and relative to the magnetic field.

(22) The poling treatment method according to any one of the above (1) to (21), wherein the film-to-be-poled is any of a dielectric material film, an insulation material film, a piezoelectric material film, a pyroelectric material film, and a ferroelectric material film.

(23) A magnetic field poling device comprising:
  a first holding part configured to hold a film-to-be-poled;
  a second holding part configured to hold a magnet generating a magnetic field to the film-to-be-poled; and
  a moving mechanism configured to move the first holding part or the second holding part in a direction perpendicular to the magnetic field.

(24) The magnetic field poling device according to the above (23), wherein the magnet is the one generating the magnetic field in a direction parallel to the thickness direction of the film-to-be-poled, and wherein the moving mechanism is the one that rotates the first holding part or the second holding part.

(25) The magnetic field poling device according to the above (24), wherein the poling treatment is performed on a 90° domain in a direction perpendicular to the thickness direction of the film-to-be-poled being held by the first holding part, by rotating the first holding part or the second holding part by the moving mechanism, while causing the magnet to generate the magnetic field in a direction parallel to the film-thickness direction.

(26) The magnetic field poling device according to the above (23), wherein the magnet is the one generating the magnetic field in a direction perpendicular to the thickness direction of the film-to-be-poled, and wherein the moving mechanism is the one that rotates the first holding part or the second holding part.

(27) The magnetic field poling device according to the above (26), wherein the poling treatment is performed on a 180° domain in a direction parallel to the thickness direction of the film-to-be-poled being held by the first holding part, by rotating the first holding part or the second holding part by the moving mechanism, while causing the magnet to generate the magnetic field in a direction perpendicular to the film-thickness direction.

(28) The magnetic field poling device according to the above (25) or (27), wherein the poling treatment is performed while cooling the film-to-be-poled from the Curie temperature or higher.

(29) The magnetic field poling device according to any one of the above (23) to (28), wherein the film-to-be-poled is formed on a substrate, and wherein the first holding part holds the substrate.

(30) The magnetic field poling device according to any one of the above (23) to (29), wherein the film-to-be-poled is any of a dielectric material film, an insulation material film, a piezoelectric material film, a pyroelectric material film, and a ferroelectric material film.

(31) A piezoelectric film comprising a 90° domain in a direction perpendicular to the thickness direction of the piezoelectric film, being poled.

(32) The piezoelectric film according to the above (31), wherein a 180° domain in a direction parallel to the thickness direction of the piezoelectric film is poled.

(33) The piezoelectric film according to the above (31) or (32), wherein the piezoelectric film is a pyroelectric film or a ferroelectric film.

(34) The piezoelectric film according to any one of the above (31) to (33), wherein the piezoelectric film is formed by a sol-gel method or a sputtering method.

3. Effect of the Invention

According to an aspect of the present invention, the poling treatment can be performed in a simple procedure by the dry process. In addition, according to another aspect of the present invention, the characteristics of a piezoelectric film subjected to poling treatment can be enhanced.

DETAILED DESCRIPTION OF THE INVENTION

Hereinafter, the embodiment of the present invention will be explained particularly using the drawings. However, a person skilled in the art would understand easily that the present invention is not limited to the explanations below, but that the form and detail thereof are changeable variously without deviating from the purport and the scope of the present invention. Accordingly, the present invention should not be construed as being limited to the described contents of the embodiment shown below.

<90° Domain and 180° Domain>

Figure 1:
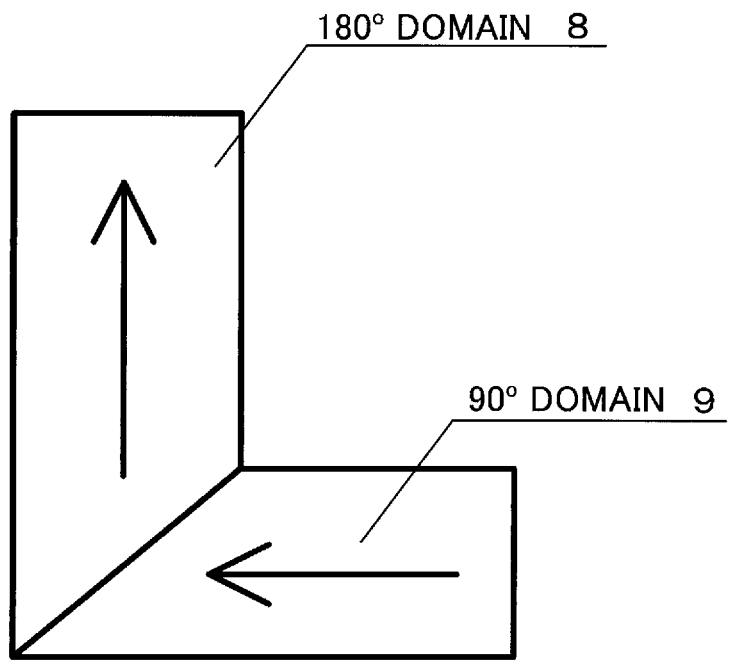
FIG. 1 is a diagram schematically illustrating a 90° domain and a 180° domain in a piezoelectric film according to an aspect of the present invention.

FIG. 1 is a diagram schematically illustrating a 90° domain and a 180° domain in a piezoelectric film according to an aspect of the present invention.

The piezoelectric film has a 90° domain 9 and a 180° domain 8. The 90° domain 9 refers to a domain perpendicular to the thickness direction of the piezoelectric film. The 180° domain 8 refers to a domain parallel to the thickness direction of the piezoelectric film.

<Magnetic Field Poling Device>

Figure 2:
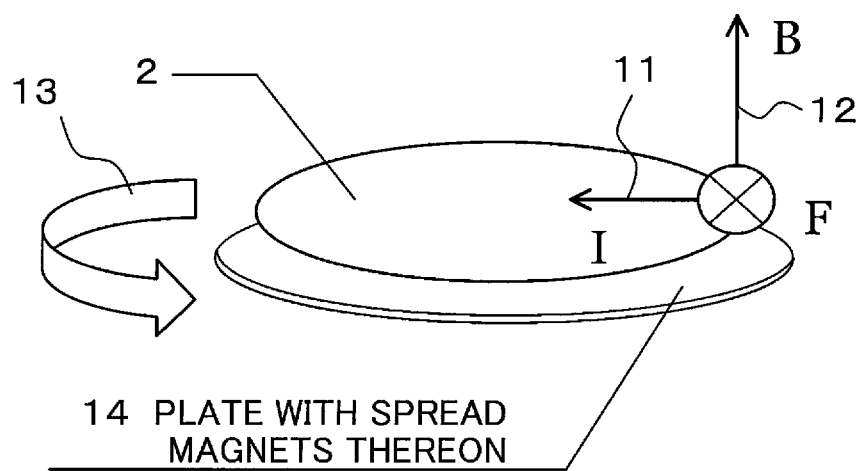
FIG. 2 is a conceptual diagram schematically illustrating a magnetic field poling device according to an aspect of the present invention.

FIG. 2 is a conceptual diagram schematically illustrating a magnetic field poling device according to an aspect of the present invention.

The magnetic field poling device is a device for performing poling treatment on the 90° domain of a film-to-be-poled 2, and the poling treatment on the 90° domain is a poling treatment being carried out by generating an electric field (current I) perpendicular to the thickness direction of the film-to-be-poled 2 (for example, the direction of an arrow 11 in FIG. 2).

The film-to-be-poled 2 is a film before being subjected to poling treatment. Although the details of the film-to-be-poled 2 will be described later, the film-to-be-poled 2 may be any of a dielectric material film, an insulation material film, a piezoelectric material film, a pyroelectric material film, and a ferroelectric material film. In addition, the film-to-be-poled 2 is preferably formed on a substrate, and various kinds of shapes of the substrate can be used. The details of the substrate will be described later.

The configuration for generating a current I in the direction indicated by the arrow 11 in FIG. 2 will be described below in detail.

A plate 14 having magnets spread thereon is located in the lower part of the film-to-be-poled 2, and a magnetic field B is generated by the magnets in a direction parallel to the thickness direction of the film-to-be-poled 2 (for example, in the direction of an arrow 12 in FIG. 2). The film-to-be-poled 2 is in a fixed state, and the plate 14 is rotated in the direction indicated by an arrow 13 by a rotary mechanism (not shown). Therefore, the magnetic field B is moved in a direction perpendicular to the thickness direction of the film-to-be-poled 2. In other words, since the magnetic field B is moved relative to the film-to-be-poled 2, the film-to-be-poled 2 to which the magnetic field B is applied in the direction indicated by the arrow 12 is moved by a force F applied in a direction perpendicular to the direction of the magnetic field B (the direction indicated by the arrow 13).

As a result, by the Fleming's rule, the current I is generated in the film-to-be-poled 2 from the outside toward the center of the film-to-be-poled 2. The intensity of the magnetic field is preferably larger than 1000 G/100 mT, and more preferably 2310 G/231 mT because sufficient poling cannot be performed at the magnetic field intensity of 1000 G/100 mT or smaller.

Meanwhile, although in FIG. 2, the current I is generated in the direction indicated by the arrow 11, the current I may be generated in the direction opposite to the arrow 11 (in the direction going from the center to the outside of the film-to-be-poled 2), and in that case, the direction of magnetic field and the rotational direction of the plate 14 may be changed in accordance with the Fleming's rule.

Furthermore, although in FIG. 2, the film-to-be-poled 2 is fixed and the plate 14 is rotated, the plate 14 may be fixed and the film-to-be-poled 2 may be rotated because it suffices that the film-to-be-poled 2 has only to move in a direction perpendicular to the film-thickness direction thereof and relative to the magnetic field.

Moreover, in FIG. 2, the poling treatment is performed on the 90° domain of the film-to-be-poled 2 by, while generating the magnetic field B in a direction parallel to the thickness direction of the film-to-be-poled 2, moving the film-to-be-poled 2 in the perpendicular direction 13 to the thickness direction of the film-to-be-poled 2 and relative to the magnetic field B. However, it is also possible to change the configuration so as to perform the poling treatment on the 180° domain of the film-to-be-poled 2.

Particularly, while generating the magnetic field in a direction perpendicular to the thickness direction of the film-to-be-poled 2, the film-to-be-poled 2 is moved in a direction perpendicular to the film-thickness direction thereof (for example, the direction indicated by the arrow 13), in a direction perpendicular to the magnetic field, and relative to the magnetic field. Therefore, the current can be generated in the film-to-be-poled 2 in a direction parallel to the film-thickness direction, and thereby there can be performed the poling treatment on the 180° domain of the film-to-be-poled 2.

Figure 3:
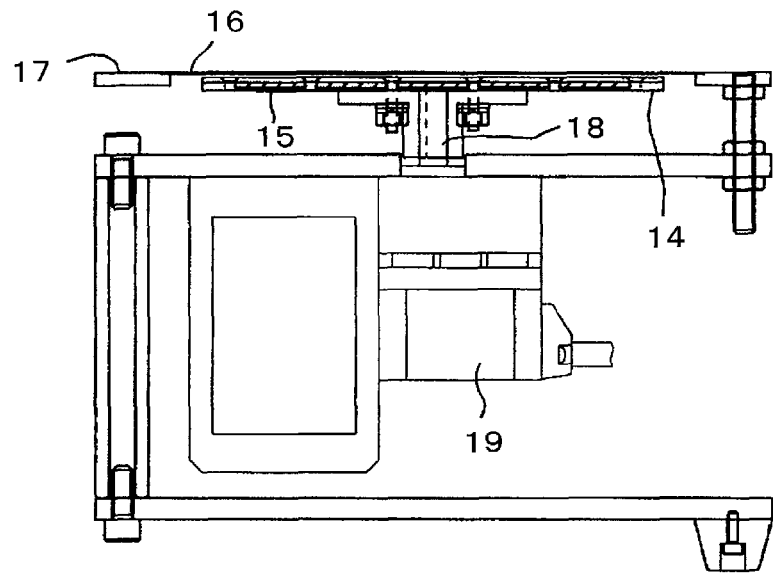
FIG. 3 is a detailed side view illustrating a magnetic field poling device according to an aspect of the present invention.

FIG. 3 is a detailed side view of a magnetic field poling device according to an aspect of the present invention. The magnetic field poling device performs poling treatment on the 90° domain of the film-to-be-poled 2.

The magnetic field poling device has an aluminum plate 16 for placing the film-to-be-poled thereon. The use of aluminum as the plate 16 is for allowing easy cooling of the film-to-be-poled by aluminum having excellent heat radiation property, in performing the magnetic field poling on the film-to-be-poled. The aluminum plate 16 is fixed so as not to move by a fixing tool 17.

Under the aluminum plate 16, the plate 14 for locating a plurality of magnets 15 thereon is arranged. The plate 14 is connected to a motor 19 via a rotary shaft 18, and the plate 14 together with the rotary shaft 18 is rotated by the motor 19.

Figure 4:
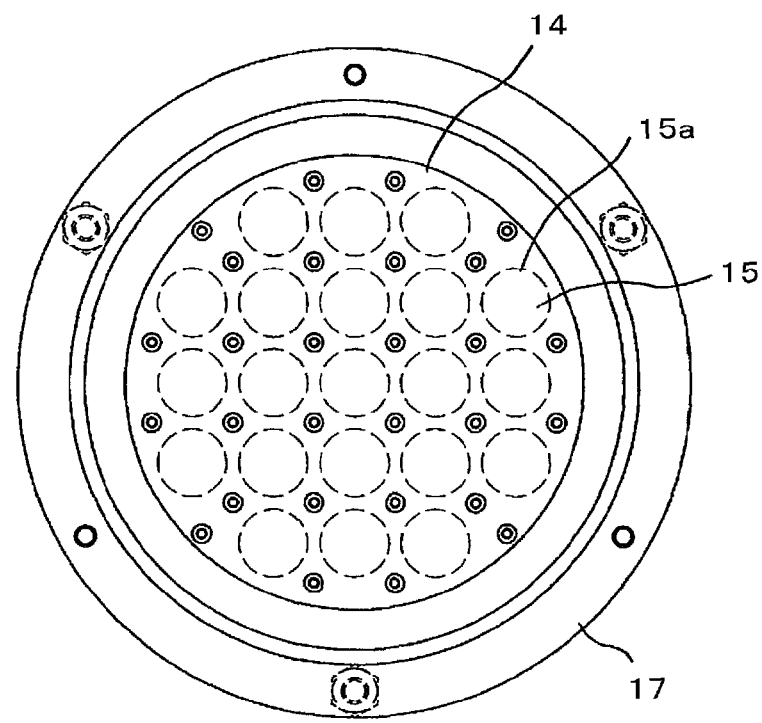
FIG. 4 is a top view illustrating a state of having removed the aluminum plate 16 of the magnetic field poling device shown in FIG. 3.
Figure 5:
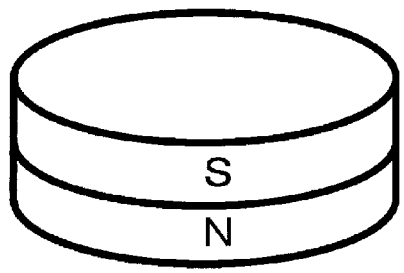
FIG. 5(A) is a perspective view illustrating the magnet 15 shown in FIG. 4 for performing poling treatment on the 90° domain.
FIG. 5(B) is a perspective view illustrating the magnet 15 shown in FIG. 4 for performing poling treatment on the 180° domain.
Figure 5:
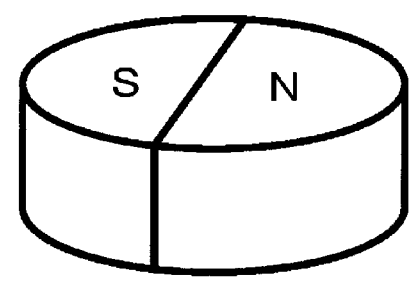

FIG. 4 is a top view illustrating a state of having removed the aluminum plate 16 of the magnetic field poling device shown in FIG. 3. The fixing tool 17 shown in FIG. 4 is intended to be fixed by placing the aluminum plate 16 thereon. FIG. 5(A) is a perspective view illustrating the magnet 15 in FIG. 4 for performing poling treatment on the 90° domain.

The plate 14 is provided with a plurality of holes 15a capable of inserting the respective magnets 15 therein, and the magnets 15 are placed in each of the plurality of holes 15a. As the magnet 15, for example, a cylindrical shape samarium cobalt magnet ($\phi$ 25 mm×$\phi$ 10 mm×2 mm) as shown in FIG. 5(A) may be used. The samarium cobalt magnet has an N-pole at upper surface and an S-pole at lower surface, and the magnetization direction is the height direction of the magnet. The surface of the samarium cobalt magnet is subjected to Ni plating.

<Plasma Poling Device>

Figure 6:
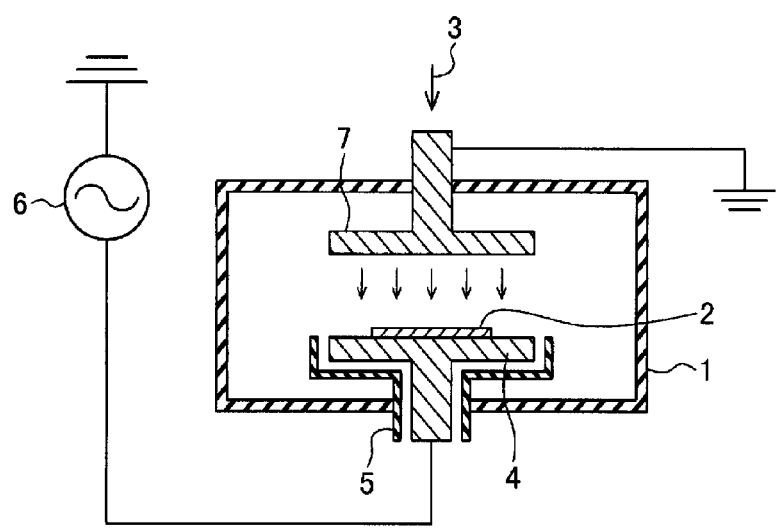
FIG. 6 is a cross sectional view schematically illustrating a plasma poling device according to an aspect of the present invention.

FIG. 6 is a cross-sectional view schematically illustrating a plasma poling device according to an aspect of the present invention. The plasma poling device is a device for performing poling treatment on the 180° domain of the film-to-be-poled 2.

The plasma poling device has a poling chamber 1. At a lower part of the poling chamber 1, there is positioned a holding electrode 4 for holding a substrate (not shown) having the film-to-be-poled 2. The film-to-be-poled 2 is formed on the surface of the substrate.

The holding electrode 4 is electrically connected to a high-frequency power source 6, and also functions as an RF-applying electrode. Periphery and lower part of the holding electrode 4 are shielded by a ground shield 5. Meanwhile, although this embodiment adopts the high-frequency power source 6, other power source such as DC power source or microwave power source may be used.

In the upper part within the poling chamber 1, a gas-shower electrode (counter electrode) 7 is located facing and at a position parallel to the holding electrode 4. The gas-shower electrodes 7 and the holding electrode 4 are a pair of parallel flat-plate electrodes. The gas-shower electrode is connected to a ground potential. In this embodiment, the power source is connected to the holding electrode 4, and the ground potential is connected to the gas-shower electrode. However, the ground potential may be connected to the holding electrode 4, and the power source may be connected to the gas-shower electrode.

On the lower surface of the gas-shower electrode 7, there is formed a plurality of supply ports (not shown) for supplying a plasma-forming gas in shower form on the surface side of the film-to-be-poled 2 (the space between the gas-shower electrode 7 and the holding electrode 4). Applicable plasma-forming gas includes Ar, He, $N_2$, $O_2$, $F_2$, $C_xF_y$, and air.

A gas-introduction route (not shown) is provided inside the gas-shower electrode 7. One side of the gas-introduction route is connected to the above-described supply ports, whereas the other side thereof is connected to a plasma-forming gas supply mechanism 3. In addition, in the poling chamber 1, an exhaust port for evacuating the inside of the poling chamber 1 is provided. The exhaust port is connected to an exhaust pump (not shown).

Furthermore, the plasma poling device has the high-frequency power source 6, the plasma-forming gas supply mechanism 3, and a control unit (not shown) for controlling the exhaust pump and the like. The control unit controls the plasma poling device so as to perform the poling treatment described later.

Moreover, the plasma poling device preferably has a temperature-control mechanism to control the temperature of the film-to-be-poled 2 to be a variety of temperatures in performing the poling treatment.

Poling Treatment Method

The poling treatment method according to an aspect of the present invention will be described below. The term "poling treatment method" referred to herein is not limited to the poling treatment by magnetism (that is, the polarization treatment is a process for providing a ferroelectric material with piezoelectric activity through the utilization of the electromotive force generated in a ceramic piece, when the ceramic piece applied with a magnetic field in a certain direction moves relative to the magnetic field), or to the poling treatment by what is called the strong electric field (that is, polarization treatment is a process for providing a ferroelectric material with piezoelectric activity by applying DC high electric field to a ceramic piece provided with an electrode), but also includes the thermal poling. Specifically, the thermal poling can provide the ferroelectric material with anisotropy in advance by applying a magnetic field, a DC voltage, or a high frequency thereto while heating thereof, followed by cutting off the magnetic field, the voltage, or the high frequency. Application of thermal energy put the ions in the dielectric material into a state of easily moving, application of magnetic field or voltage in that state induces ion migration and polarization, and as a result, the entire substrate is subjected to prompt poling.

Meanwhile, in performing the thermal poling, it is necessary to add a heating mechanism to the poling device and to heat the film-to-be-poled.

[1] Film-to-be-Poled

First, a film-to-be-poled is prepared. The film-to-be-poled is a film before being subjected to the poling treatment, and is preferably any of, for example, a dielectric material film, an insulation material film, a piezoelectric material film, a pyroelectric material film, and a ferroelectric material film. The piezoelectric material film is preferably formed by a sol-gel method or a sputtering method.

In addition, the film-to-be-poled is preferably formed on a substrate. Since the poling treatment is effective for all the inorganic substances and organic substances having super-conductive, dielectric, piezoelectric, pyroelectric, ferroelectric, and nonlinear optical characteristics, various kinds of film-to-be-poled can be used in the poling treatment.

Specific examples of applicable materials that can be the film-to-be-poled are:
$TiO_2$, $MgTiO_3$—$CaTiO_3$-based, $BaTiO_3$-based, $CaSnO_3$, $SrTiO_3$, $PbTiO_3$, $CaTiO_3$, $MgTiO_3$, $SrTiO_3$, $CaTiO_3$-based, $BaTiO_3$-based, $BaO$—$R2O3$-$nTiO2$-based (R=Nd, Sm, . . . , n=4, 5, . . . ), $Al_2O_3$, diamond-based (such as diamond-like carbon), BN, SiC, BeO, AlN, $BaTi_3O_{11}$, $Ba_2Ti_3O_{20}$, tungsten bronze $A_xBO_3$: $Ba_2NaNb_5O_{15}$ (BNN), $Ba_2NaTa_5O_{15}$ (BNT), $Sr_2NaNb_5O_{15}$ (SNN), $K_3Li_2Nb_5O_{15}$ (KLN), $K_2BiNb_5O_{15}$ (KEN) perovskite-based, (K, Na, Li) (Nb, Ta, Sb) $O_3$, $Bi_xNa_{1-x}TiO_3$ (BNT), $Bi_xK_{1-x}TiO_3$ (BKT), $BiFeO_3$, $SrBi_2Ta_2O_9$ (SBT), $Bi_4Ti_3O_{12}$, $Bi_{4-x}La_xTi_3O_{12}$ (BLT), $SrBi_2Nb_2O_9$ (SBN), $Bi_2WO_4$ (BWO), SiO2, LiNbO3, LiTaO3, $Sr_{0.5}Ba_{0.5}Nb_2O_6$, KDP ($KH_2PO_4$), $C_4H_4O_6NaK.4H_2O$, $NaNO_2$, $(NH_2)_2CS$, $K_2SeO_4$, $PbZrO_3$, $(NH_2)_2CS$, $(NH_4)$ $SO_4$, $NaNbO_3$, $BaTiO_3$, $PbTiO_3$, $SrTiO_3$, $KNbO_3$, $NaNbO_3$, $BiFeO_3$, (Na, La) (Mg, W)$O_3$, $La_{1/3}NbO_3$, $La_{1/3}TaO_3$, $Ba_2MgTa_2O_9$, $Sr_4NaSb_3O_{12}$, $A_2BRO_6$ (A: alkali earth, B: Fe or Ln, R: Mo, Mn, W, or Ru, two or more of valence difference between R and B), $Bi_2NiMnO_6$, $Sr_2FeMoO_6$, $BaLnMn_2O_6$, $Na_xWO_3$, $Ln_{1/3}NbO_3$, $Ba_2In_2O_5$, $Sr_2Fe_2O_5$, $Sr_2Nd_2O_7$, $Sr_2Ta_2O_7$, $La_2Ti_2O_7$, $MgSiO_3$, $CaIrO_3$, $CuNMn_3$, $GaNMn_3$, $ZnNMn_3$, $CuNMn_3$, $Ca_2MnO_4$, $FeTiO_3$, LiNbO3, LiTaO3, $Gd_2(MoO_4)_3$, $SrTiO_3$, $KTaO_3$, $RFe2O4$, $La_{2-x}Sr_xCuO_4$, $Me_3B_7O_{13}X$ (Me ion radius of 0.97 Å ($Cd^{2+}$)-0.66 Å ($Mg^{2+}$), X: halogen), $Ni_3B_7O_{13}I$, $BiFeO_3$, $BiMnO_3$, $Pb_2$ $(CO_{1/2}W_{1/2})O_3$, $Pb(Fe_{1/2}Nb_{1/2})O_3$, $A_2BRO_6$ (A: alkali earth, B: Fe or Ln, R: Mo, Mn, W, or Ru, two or more of valence difference between R and B), $Bi_2NiMnO_6$, $YMnO_3$, $YbMnO_3$, $HoMnO_3$, $BaMnF_4$, $BaFeF_4$, $BaNiF_4$, $BaCoF_4$, $YFe_2O_4$, $LuFe_2O_4$, $TbMnO_3$, $DyMnO_3$, $Ba_2Mg_2Fe_{12}O_{22}$, $CuFeO_2$, $Ni_3V_2O_8$, $LiCu_2O_2$, $LiV_2O_4$, $LiCr_2O_4$, $NaV_2O_4$, $NaCr_2O_4$, $CoCr_2O_4$, $LiFeSi_2O_6$, $NaCrSi_2O_6$, $LiFeSi_2O_6$, $NaCrSi_2O_6$, $MnWO_4$, $TbMn_2O_5$, $DyMn_2O_5$, $HoMn_2O_5$, $YMn_2O_5$ R=Tb, Dy, Ho, or Y, $RbFe(MoO_4)_2$, $Pr_3Ga_5SiO_{14}$, $Nd_3Ga_5SiO_{14}$, $Nd_3Ga_5SiO_{14}$, $A_3BFe_3Si_2O_{14}$ A=Ba, Sr, or Ca, B=Nb or T, various pyrochlore oxides, crystal (SiO2), LiNbO3, BaTiO3, PbTiO3 (PT), Pb(Zr, Ti)O3 (PZT), Pb(Zr, Ti, Nb)O3 (PZTN), PbNb2O6, PVF2, PMN-PZT, lead magnesium niobate-PZT-based>Pb(Mg⅓Nb⅔)O3 (PMN)-PZT, Pb(Ni⅓Nb⅔)O3 (PNN)-PZT, Pb(Mg⅓Nb⅔)O3 (PMN)-PT, Pb(Ni⅓Nb⅔)O3 (PNN)-PT, Pb(Mg⅓Nb⅔)O3-PbTiO3 (PMN-PT), BaTiO3, (Sr1-x, Bax)TiO3, (Pb1-y, Bay) (Zr1-x, Tix)O3 (x=0-1, y=0-1), CdTiO3, HgTiO3, CaTiO3, GdFeO3, SrTiO3, PbTiO3, BaTiO3, PbTiO3, PbZrO3, Bi0.5Na0.5TiO3, Bi0.5K0.5TiO3, KNbO3, LaAlO3, FeTiO3, MgTiO3, CoTiO3, NiTiO3, CdTiO3, (K1-xNax) NbO3, K(Nb1-xTax)O3, (K1-xNax) (Nb1-yTay)O3, KNbO3, RbNbO3, TlNbO3, CsNbO3, AgNbO3, $Pb(Ni_{1/3}Nb_{2/3})O_3$, $Ba(Ni_{1/3}Nb_{2/3})O_3$, $Pb(Sc_{1/2}Nb_{1/2})O_3$, $(Na_{1/2}Bi_{1/2})TiO_3$, $(K_{1/2}Bi_{1/2})TiO_3$, $(Li_{1/2}Bi_{1/2})O_3$, $Bi(Mg_{1/2}Ti_{1/2})O_3$, $Bi(Zn_{1/2}Ti_{1/2})O_3$, $Bi(Ni_{1/2}Ti_{1/2})O_3$, $(Bi, La)(Mg_{1/2}Ti_{1/2})O_3$, $(A^{1+}_{1/2}A^{3+}_{1/2})(B^{2+}_{1/3}B^{5+}_{2/3})O_3$ (A and B: $A^{1+}$=Li, Na, K, or Ag; $A^{2+}$=Pb, Ba, Sr, or Ca; $A^{3+}$=Bi, La, Ce, or Nd; $B^{1+}$=Li or Cu; $B^{2+}$=Mg, Ni, Zn, Co, Sn, Fe, Cd, Cu, or Cr; $B^{3+}$=Mn, Sb, Al, Yb, In, Fe, Co, Sc, Y, or Sn; $B^{4+}$=Ti or Zr; $B^{5+}$=Nb, Sb, Ta, or Bi; $B^{6+}$=W, Te, or Re), $Pb(Mg_{1/3}Nb_{2/3})O3$ (PMN), $Pb(Mg_{1/3}Ta_{2/3})O3$ (PMTa), $Pb(Mg_{1/2}W_{1/2})O3$ (PMW), $Pb(Ni_{1/3}Nb_{2/3})O3$ (PNN), $Pb(Ni_{1/3}Ta_{2/3})O3$ (PNTa), $Pb(Ni_{1/2}W_{1/2})O3$ (PNW), $Pb(Zn_{1/3}Nb_{2/3})O3$ (PZN), $Pb(Zn_{1/3}Ta_{2/3})O3$ (PZTa), $Pb(Zn_{1/2}W_{1/2})O3$ (PZW), $Pb(Sc_{1/2}Nb_{1/2})O3$ (PScN), $Pb(Sc_{1/2}Ta_{1/2})O3$ (PScTa), $Pb(Cd_{1/3}Nb_{2/3})O3$ (PCdN), $Pb(Cd_{1/3}Ta_{2/3})O3$ (PCdT), $Pb(Cd_{1/2}W_{1/2})O3$ (PCdW), $Pb(Mn_{1/3}Nb_{2/3})O3$ (PMnN), $Pb(Mn_{1/3}Ta_{2/3})O3$ (PMnTa), $Pb(Mn_{1/2}W_{1/2})O3$ (PMnW), $Pb(Co_{1/3}Nb_{2/3})O3$ (PCoN), $Pb(Co_{1/3}Ta_{2/3})O3$ (PCoTa), $Pb(Co_{1/2}W_{1/2})O3$ (PCoW), $Pb(Fe_{1/2}Nb_{1/2})O3$ (PFN), $Pb(Fe_{1/2}Ta_{1/2})O3$ (PFTa), $Pb(Fe_{2/3}W_{1/3})O3$ (PFW), $Pb(Cu_{1/3}Nb_{2/3})O3$ (PCuN), $Pb(Yb_{1/2}Nb_{1/2})O3$ (PYbN), $Pb(Yb_{1/2}Ta_{1/2})O3$ (PYbTa), $Pb(Yb_{1/2}W_{1/2})O3$ (PYbW), $Pb(Ho_{1/2}Nb_{1/2})O3$ (PHoN), $Pb(Ho_{1/2}Ta_{1/2})O3$ (PHoTa), $Pb(Ho_{1/2}W_{1/2})O3$ (PHoW), $Pb(In_{1/2}Nb_{1/2})O3$ (PInN), $Pb(In_{1/2}Ta_{1/2})O3$ (PInTa), $Pb(In_{1/2}W_{1/2})O3$ (PInW), $Pb(Lu_{1/2}Nb_{1/2})O3$ (PLuN), $Pb(Lu_{1/2}Ta_{1/2})O3$ (PLuTa), $Pb(Lu_{1/2}W_{1/2})O3$ (PLuW), $Pb(Er_{1/2}Nb_{1/2})O3$ (PErN), $Pb(Er_{1/2}Ta_{1/2})O3$ (PErT), $Pb(Sb_{1/2}Nb_{1/2})O3$ (PSbN), $Pb(Sb_{1/2}Ta_{1/2})O3$ (PSbT), BaZrO3-BaTiO3, BaTiO3-SrTiO3, $Pb(Mg_{1/3}Nb_{2/3})O3$, $Pb(Sc_{1/2}Nb_{1/2})O3$, $Pb(Mg_{1/3}Nb_{2/3})O3$ (PMN), PMN-PbTiO3, PMN-PZT, nonlinear optical material (inorganic substance) for example garnet crystal (YAG, YAO, YSO, GSGG, GGG), fluoride crystal (YLF, LiSAF, LiCAF), tungstate crystal (KGW, KYW), and vanadate crystal (such as YVO4 and GdVO4). Further there can be used BBO, CBO, CLBO, YCOB, GdCOB, GdYCOB, KTP, KTA, KDP, and LiNbO3.

Examples of the organic nonlinear optical material are: (R)-(+)-2-(α-methylbenzylamino)-5-nitropyridine (Molecular Formula/Molecular weight: $C_{13}H_{13}N_3O_2$=243.26), (S)-(−)-2-(α-methylbenzylamino)-5-nitropyridine (Molecular Formula/Molecular weight: $C_{13}H_{13}N_3O_2$=243.26), (S)-(−)-N-(5-nitro-2-pyridyl)alaninol (molecular formula/molecular weight: $C_8H_{11}N_3O_3$=197.19), (S)-(−)-N-(5-nitro-2-pyridyl) prolinol (molecular formula/molecular weight: C10H13N3O3=223.23), (S)—N-(5-nitro-2-ptridyl)phenyl-alaninol (molecular formula/molecular weight: C14H15N3O3=273.29), 1,3-dimethylurea (molecular formula/molecular weight: C3H8N20=88.11), 2-(N,N-dimethylamino)-5-nitroacetanilide (molecular formula/molecular weight: C10H13N3O3=223.23), 2-amino-3-nitropyridine (molecular formula/molecular weight: C5H5N3O2=139.11), 2-amino-5-nitropyridine (molecular formula/molecular weight: C5H5N3O2=139.11), 2-amino-fluorene (molecular formula/molecular weight: C13H11N=181.23), 2-chloro-3,5-dinitropyridine (molecular formula/molecular weight: C5H2ClN3O4=203.54), 2-chloro-4-nitro-N-methylaniline (molecular formula/molecular weight: C7H7ClN2O2=186.60), 2-chloro-4-nitroaniline (molecular formula/molecular weight: C6H5ClN2O2=172.57), 2-methyl-4-nitroaniline (molecular formula/molecular weight: C7H8N2O2=152.15), 2-nitroaniline (molecular formula/molecular weight: C6H6N2O2=138.12), 3-methyl-4-nitroaniline (molecular formula/molecular weight: C7H8N2O2=152.15), 3-nitroaniline (molecular formula/molecular weight: C6H6N2O2=138.12), 4-amino-4'-nitrobiphenyl (molecular formula/molecular weight: C12H10N2O2=214.22), 4-dim-ethylamino-4'-nitro-biphenyl (molecular formula/molecular weight: C14H14N2O2=242.27), 4-dimethylamino-4'-nitrostilbene (molecular formula/molecular weight C16H16N2O2=268.31), 4-hydroxy-4'-nitrobiphenyl (molecular formula/molecular weight: C12H9NO3=215.20), 4-methoxy-4'-nitrobiphenyl (molecular formula/molecular weight: C13H11NO3=229.23), 4-methoxy-4'-nitrostilbene (molecular formula/molecular weight: C15H13NO3=255.27), 4-nitro-3-picoline N-oxide (molecular formula/molecular weight: C6H6N2O3=154.12), 4-nitroaniline (molecular formula/molecular weight: C6H6N2O2=138.12), 5-nitroindole (molecular formula/molecular weight: C8H6N2O2=162.15), 5-nitrouracil (molecular formula/molecular weight: C4H3N3O4=157.08), N-(2, 4-dinitrophenyl)-L-alaninemethyl (molecular formula/molecular weight: C10H11N3O6=269.21), N-cyanomethyl-N-methyl-4-nitroaniline (molecular formula/molecular weight: C9H9N3O2=191.19), N-methyl-4-nitro-o-toluidine (molecular formula/molecular weight: C8H10N2O2=166.18), and N-methyl-4-nitroaniline (molecular Formula/molecular weight: C7H8N2O2=152.15). They can be used as the film-to-be-poled, and are not the limited ones.

In addition, the substrate on which the film-to-be-poled is formed may be preferably any of a silicon wafer, a metal substrate, a metal substrate having oxidation resistance, a metal substrate having heat resistance at the Curie temperature of the film-to-be-poled, an iron-based substrate (preferably an iron-based alloy substrate, a stainless-based substrate, a SUS substrate, and the like), and a Ni-based substrate (such as a Ni-alloy substrate).

Furthermore, the substrate on which the film-to-be-poled is formed may be preferably any of a glass substrate, a glass substrate having oxidation resistance, and a glass substrate having heat resistance at the Curie temperature of the film-to-be-poled.

Since the metal substrate has a large thermal expansion coefficient and a large Young's modulus, the substrate has advantages of, in performing poling treatment by applying an electric field to a piezoelectric material film, allowing the piezoelectric material film to easily move and easily giving piezoelectric activity to the piezoelectric material film.

Moreover, the metal substrate or glass substrate having oxidation resistance has an advantage of being able to withstand oxygen atmosphere in performing crystallization treatment on the piezoelectric material film in an oxygen atmosphere. Meanwhile, the piezoelectric material film is subjected to poling treatment after performing the crystallization treatment in an oxygen atmosphere. The crystallization treatment may be performed in a pressurized oxygen atmosphere.

In addition, the metal substrate or glass substrate having heat resistance has an advantage of being able to withstand a heating temperature in performing the poling treatment by heating the substrate.

[2] Poling Treatment of 90° Domain (Magnetic Field Poling Device for 90° Domain)

Next, there will be given a description of performing the poling treatment on the film-to-be-poled 2 through the use of the magnetic field poling device illustrated in FIG. 3, FIG. 4, and FIG. 5(A).

The film-to-be-poled 2 is heated at the Curie temperature or higher (preferably a temperature obtained by the Curie temperature plus 100° C., or higher) by using a hot plate. When the film-to-be-doped 2 is, for example, PZT, the spontaneous polarization begins to be lost at a temperature range of 250° C. to 270° C., and the Curie temperature is near 380° C.

After that, the heated film-to-be-poled 2 is placed on the aluminum plate 16.

Subsequently, the 90° domain of the film-to-be-poled 2 is subjected to the poling treatment.

Particularly, while generating a magnetic field in a direction parallel to the thickness direction of the film-to-be-poled 2 by the magnets 15 spread all over the plate 14, the plate 14 is rotated together with the rotary shaft 18 by the motor 19. Consequently, the magnetic field is moved relative to the film-to-be-poled 2, and thus, as illustrated in FIG. 2, the film-to-be-poled 2 to which the magnetic field B is applied in the direction shown by the arrow 12 is moved by a force F applied perpendicular to the direction of the magnetic field B (the direction of the arrow 13). As a result, by the Fleming's rule, the current I is generated in the film-to-be-poled 2 from the outside toward the center of the film-to-be-poled 2.

Through the above procedure, the poling treatment on the 90° domain of the film-to-be-poled 2 can be performed while cooling the film-to-be-poled 2 from the Curie temperature or higher (preferably a temperature obtained by the Curie temperature plus 100° C., or higher) by using the aluminum plate 16. When a ferroelectric material film is used as the film-to-be-poled 2, a piezoelectric activity can be given to the 90° domain of the ferroelectric material film by performing the above-described poling treatment on the 90° domain as described above.

According to the present embodiment, the film-to-be-poled 2 is heated in advance, and the poling treatment is performed while cooling the film-to-be-poled 2 by using the aluminum plate 16, and thus the heating of magnets 15 during the poling treatment can be suppressed. Consequently, the deterioration of magnets 15 can be suppressed.

In addition, according to the present embodiment, since the poling treatment is performed at the Curie temperature or higher (preferably a temperature obtained by the Curie temperature plus 100° C., or higher), a piezoelectric activity can be efficiently given to the film-to-be-poled 2.

Meanwhile, although in the present embodiment, the poling treatment on the 90° domain of the film-to-be-poled 2 is performed at the Curie temperature or higher, the poling treatment on the 90° domain of the film-to-be-poled 2 may be performed at a temperature lower than the Curie temperature.

[3] Poling Treatment of 180° Domain

Next, there will be given a description of performing the poling treatment on the 180° domain, of the film-to-be-poled 2 obtained by performing the poling treatment on the 90° domain.

The poling treatment on the 180° domain is the poling treatment performed by generating an electric field in a direction parallel to the thickness direction of the film-to-be-poled 2. Three methods described below can be used.

[3-1] Plasma Poling Device Illustrated in FIG. 6

First, the film-to-be-poled 2 is inserted into the poling chamber 1, and the film-to-be-poled 2 is held on the holding electrode 4 in the poling chamber 1.

Then, the film-to-be-poled 2 is subjected to the poling treatment.

Particularly, the poling chamber 1 is evacuated by the exhaust pump. Subsequently, through the supply ports on the gas-shower electrode 7, the plasma-forming gas (such as one or more gases selected from the group consisting of inert gas, $H_2$, $N_2$, $O_2$, $F_2$, $C_xH_y$, $C_xF_y$, and air) in shower form is introduced into the poling chamber 1, to thereby be supplied to the surface of the film-to-be-poled 2. Thus supplied plasma-forming gas passes between the holding electrode 4 and the ground shield 5, and then are exhausted outside the poling chamber 1 by the exhaust pump. By a balance of the supply rate of plasma-forming gas and the exhaust rate thereof, the pressure and the plasma-forming gas flow rate are controlled to be the respective specified pressure and gas flow rate and the poling chamber 1 is made into a plasma-forming gas atmosphere. Then, by applying radio frequency (RF) of, for example, 380 kHz and 13.56 MHz by the high-frequency power source 6 to thereby generate plasma, the poling treatment is performed on the film-to-be-poled 2. The poling treatment is preferably performed under the conditions of: pressure ranging from 0.01 Pa to atmospheric pressure; DC current power source; high-frequency power source or microwave power source; treatment temperature of the Curie temperature or higher of the film-to-be-poled 2 (preferably a temperature obtained by the Curie temperature plus 100° C., or higher); and DC voltage component in forming a plasma in a range of ±50 V to ±2 kV. Next, after performing the poling treatment on the 180° domain of the film-to-be-poled 2 for a specified period of time, the supply of the plasma-forming gas from the supply ports of the gas-shower electrode 7 is stopped and the poling treatment is completed.

When a ferroelectric material film is used as the film-to-be-poled 2, a piezoelectric activity can be given to the 180° domain of the ferroelectric material film by performing the poling treatment on the 180° domain as described above.

[3-2] Magnetic Field Poling Device for 180° Domain

As has been explained using FIG. 2 in the section of the above-mentioned <Magnetic field poling device>, while generating a magnetic field in a direction perpendicular to the thickness direction of the film-to-be-poled 2, the film-to-be-poled 2 is moved in a direction perpendicular to the film-thickness direction thereof (for example, the direction of the arrow 13 in FIG. 2), and in a direction perpendicular to and relative to the magnetic field.

For example, in the magnetic field poling device for the 90° domain explained in FIG. 3, FIG. 4, and FIG. 5(A), the magnetic field poling device for the 180° domain can be achieved by the change of the magnet 15 shown in FIG. 4 from FIG. 5(A) to FIG. 5(B). Each of the plurality of holes 15a on the plate 14 shown in FIG. 4 has each magnet placed, shown in FIG. 5(B). The direction of magnetic field generated at this time is a direction perpendicular to the thickness direction of the film-to-be-poled 2.

Through the procedure, the current can be generated in the film-to-be-poled 2 in a direction parallel to the film-thickness direction thereof, and thus the poling treatment on the 180° domain of the film-to-be-poled 2 can be performed. The poling treatment in this case is performed while cooling the film-to-be-poled 2 from the Curie temperature or higher thereof, or from a temperature obtained by the Curie temperature plus 100° C., or higher.

With the above procedure, there can be enhanced the characteristics of a piezoelectric material obtained by performing poling treatment on the 180° domain, and the like.

[3-3] DC Poling Device

Figure 9:
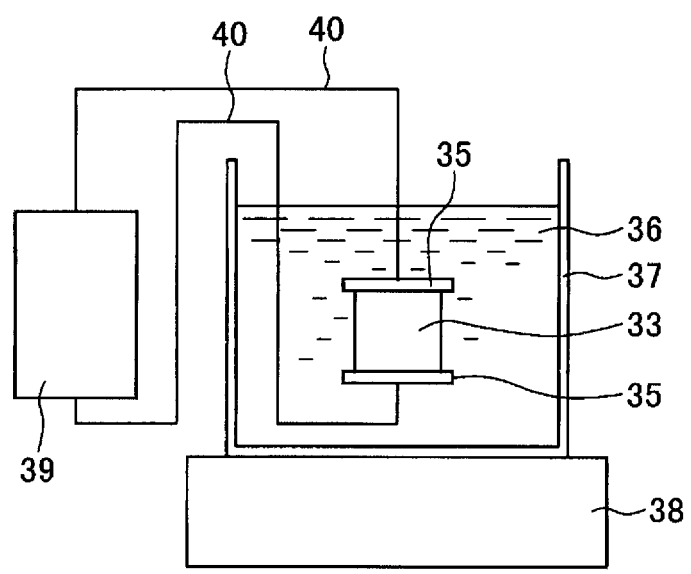
FIG. 9 is a schematic diagram illustrating a conventional poling device.

Through the use of, for example, the poling treatment apparatus utilizing DC electric field, illustrated in FIG. 9, the poling treatment on the 180° domain of the film-to-be-poled is performed while cooling the film-to-be-poled from the Curie temperature or higher thereof, or from a temperature obtained by the Curie temperature plus 100° C., or higher.

Therefore, there can be enhanced the characteristics of a piezoelectric material subjected to poling treatment, and the like.

Effect of Poling Treatment

According to the present embodiment, there can be obtained a piezoelectric film in which the 90° domain 9 in a direction perpendicular to the thickness direction of the piezoelectric film is poled, and the 180° domain 8 in a direction parallel to the thickness direction of the piezoelectric film is poled (refer to FIG. 1).

In the DC poling using the conventional DC electric field, it was considered that the 90° domain does not contribute to the piezoelectric characteristics, and thus only the 180° domain of the piezoelectric film (namely, only one direction) was poled. In contrast to this, in the present embodiment, it is considered that the 90° domain 9 assists the 180° domain 8 just like a spring action, and thus both the 90° domain 9 and the 180° domain 8 in the piezoelectric film are poled. By the poling of the 90° domain 9 for providing the piezoelectric activity to thereby enhance the assist function, the piezoelectric characteristics of the piezoelectric film can be drastically enhanced.

In addition, according to the magnetic field poling device of the present embodiment, application of a magnetic field to the film-to-be-poled 2 makes it possible to perform poling treatment on the film-to-be-poled 2. That is, the dry process makes it possible to perform the poling treatment in a simple procedure.

Furthermore, according to the plasma poling device of the present embodiment, formation of plasma at a position facing the film-to-be-poled 2 makes it possible to perform poling treatment on the film-to-be-poled 2. That is, the dry process makes it possible to perform the poling treatment in a simple procedure.

Moreover, the conventional poling device illustrated in FIG. 9 is an apparatus for performing poling treatment on a bulk material, and has difficulty in performing poling treatment on a thin film such as ferroelectric film, whereas the magnetic field poling device and the plasma poling device of the present embodiment can readily perform the poling treatment on thin film such as ferroelectric film.

In addition, the magnetic field poling device and the plasma poling device of the present embodiment can perform poling treatment even when the ferroelectric film is not diced into individual chips, in performing the poling treatment on a ferroelectric film formed on a wafer.

Furthermore, in the plasma poling device according to the present embodiment, the voltage required for the power source differs depending on the thickness of the film-to-be-poled 2 and that of the substrate on which the film-to-be-poled 2 is formed. However, since the device can perform the poling treatment at lower power source voltage than that of the conventional poling device, there is no need for power source facility larger than that of the conventional poling device.

Moreover, in the magnetic field poling device according to the present embodiment, poling treatment is performed using magnetic field, and thus the poling treatment time can be shortened compared with that of the conventional poling device, which can improve the productivity of the piezoelectric material.

In addition, in the plasma poling device according to the present embodiment, poling treatment is performed using plasma, and thus the poling treatment time can be shortened compared with that of the conventional poling device, which can improve the productivity of the piezoelectric material.

Furthermore, in the plasma poling device according to the present embodiment, no oil is used differently from the conventional poling device, and thus the work environment for a worker is not deteriorated by vaporization of oil.

EXAMPLES

Example 1

Spin coating was performed using an excessive sol-gel PZT solution of 25 wt % Pb 15% (Pb/Zr/Ti=115/52/48). As a result, the PZT solution was coated on a wafer. The coating amount per one coating was 500 μL, and the PZT thick film coating was performed under the following spin condition.

(Spin Condition)

Increase in rotational speed from 0 to 300 rpm in 3 seconds; holding for 3 seconds.

Increase in rotational speed from 300 to 500 rpm in 5 seconds; holding for 5 seconds.

Increase in rotational speed from 500 to 1500 rpm in 5 seconds; holding for 90 seconds.

For each coating cycle, as the drying (water removal) process, the substrate was held for 30 seconds on a hot plate heated to 250° C. and moisture was removed. Then, as the calcination process, evacuation was carried out using a rotary pump up to an ultimate vacuum of $10^{-1}$ Pa. Next, $N_2$ was introduced into the system to be atmospheric pressure, the substrate was heated to 450° C. for 90 seconds, and thus decomposition/removal of the organic component was performed.

The above coating, drying and calcination processes were repeated total 9 times. After that, by applying the pressure RTA (rapid thermal anneal), crystallization treatment was performed for 12 minutes at 750° C. under oxygen atmosphere and the respective PZT thick films each having a total film thickness of 3 μm were produced.

Next, the PZT thick film was heated on the hot plate for 5 minutes at 500° C., and then by using the magnetic field poling device illustrated in FIG. 3 and FIG. 4, the poling treatment was performed on the 90° domain of the PZT thick film. The treatment condition is as follows.

Treatment time: 3 minutes

Treatment temperature: natural cooling from 500° C.

Intensity of magnetic field: 2310 G (Gauss)

Rotational speed: 10 rpm

Subsequently, poling treatment was performed on the 180° domain of the PZT thick film subjected to the poling treatment of the 90° domain through the use of the plasma poling device illustrated in FIG. 6.

The power source used was RF power source of 380 kHz and 13.56 MHz. The treatment was performed under the conditions of the pressure of 1 to 30 Pa, the RF output of 70 to 700 W, the Ar gas flow rate of 15 to 30 sccm, the temperature of 25° C., and the treatment time of 1 to 5 minutes. With Reference to the Vdc monitor of the RF power source, the treatment was performed under the condition of Vdc=150 V with respect to the film thickness of 3 μm. The time was 1 minute all the time.

Comparative Example 1

In the Comparative Example 1, the PZT thick film was prepared in the same way as Example 1 except that the poling treatment was not performed on the 90° domain, and then the poling treatment was performed on the 180° domain.

Figure 7:
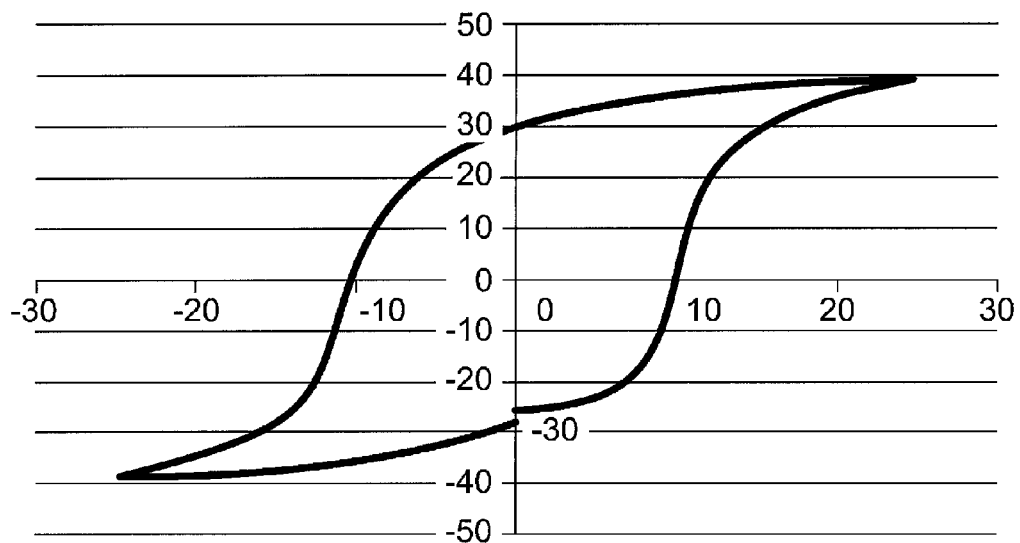
FIG. 7 is a graph showing a result of hysteresis evaluation on a PZT thick film in Example 1 (vertical axis: residual polarization Pr ($\mu C/cm^2$), horizontal axis: applied voltage Vc (V)).

FIG. 7 is a graph showing the result of hysteresis evaluation on the PZT thick film in Example 1 (vertical axis: residual polarization Pr (μC/cm$^2$), horizontal axis: applied voltage Vc (V)).

Figure 8:
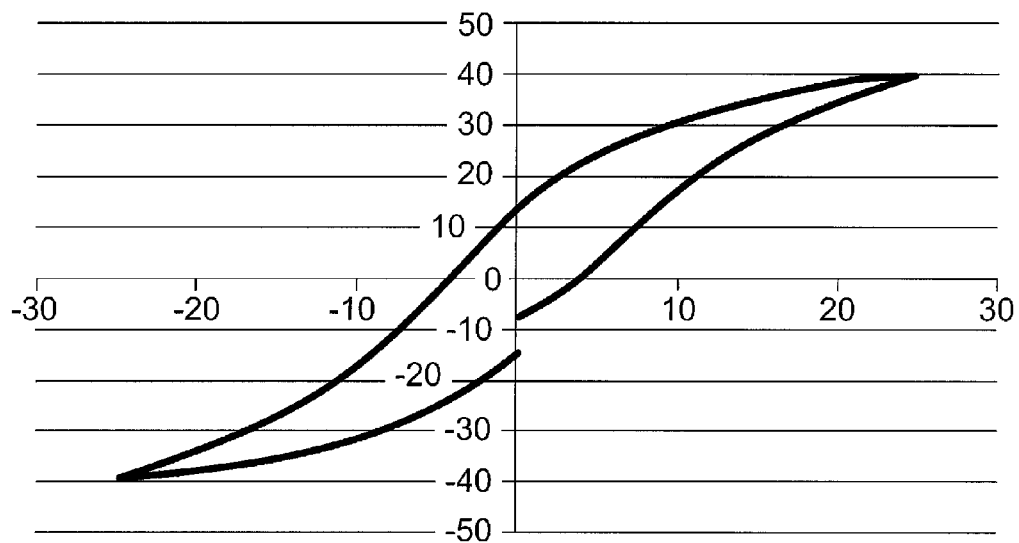
FIG. 8 is a graph showing a result of hysteresis evaluation on a PZT thick film in Comparative Example 1 (vertical axis: residual polarization Pr ($\mu C/cm^2$), horizontal axis: applied voltage Vc (V)).

FIG. 8 is a graph showing the result of hysteresis evaluation on the PZT thick film in Comparative Example 1 (vertical axis: residual polarization Pr (μC/cm$^2$), horizontal axis: applied voltage Vc (V)).

As shown in FIG. 8, the PZT thick film according to Comparative Example 1 (poling treatment was performed only on the 180° domain) gave residual polarization Pr=15 μC/cm$^2$ and applied voltage Vc=5 V, whereas, as shown in FIG. 7, the PZT thick film according to Example 1 (poling treatment was performed on both the 90° domain and the 180° domain) gave residual polarization Pr=30 μC/cm$^2$ and applied voltage Vc=10 V. In this way, it was confirmed that the polarization characteristics were able to be changed by performing poling treatment on the 90° domain.

A piezoelectric constant was measured by bipolar driving of each of the PZT thick film in Example 1 and the PZT thick film in Comparative Example 1. The result was that the piezoelectric constant of the PZT thick film in Comparative Example 1 was 40 pC/N, and that of the PZT thick film in Example 1 was 110 pC/N. Thus, it was confirmed that the piezoelectric characteristics were drastically enhanced by performing the poling on the 90° domain.

Driving of a piezoelectric material includes mainly two types of bipolar driving and unipolar driving. The bipolar driving is a driving method of applying a current in both directions, while changing the polarity of the applied voltage between positive and negative at an arbitrary frequency. In contrast to this, the unipolar driving is a driving method of applying a current in one direction without changing the polarity of the applied voltage. Generally, the bipolar driving is used in performing operation with full torque, and the like, but because of the bipolar driving, an optimal design of the hysteresis pattern is required. Especially when the drive voltage exceeds Vc, the piezoelectric characteristics secured by the poling cannot be utilized.

DESCRIPTION OF REFERENCE SYMBOLS

1 poling chamber
2 film-to-be-poled
3 plasma-forming gas supply mechanism
4 holding electrode
5 ground shield
6 high-frequency power source
7 gas-shower electrode (counter electrode)
8 180° domain of film-to-be-poled
9 90° domain of film-to-be-poled
11-13 arrow
14 plate
15 magnet
15a hole
16 aluminum plate
17 fixing tool
18 rotary shaft
19 motor
33 crystal
35 a pair of electrodes
36 oil
37 oil bath
38 heater
39 high-voltage power source
40 lead wire
B magnetic field
F force applied to film-to-be-poled
I current

The invention claimed is:

1. A poling treatment method of a film-to-be-poled by using magnetism of a magnet generating a magnetic field,
   providing said film-to-be-poled,
   wherein said film-to-be-poled is any of a dielectric material film, an insulation material film, a piezoelectric material film, a pyroelectric material film, and a ferroelectric material film,
   wherein said poling treatment is performed on a 90° domain in a direction perpendicular to the thickness direction of said film-to-be-poled, and the poling treatment on said 90° domain is performed by, while generating a magnetic field in a direction parallel to said film-thickness direction, moving said film-to-be-poled in a direction perpendicular to said film-thickness direction and relative to said magnetic field, and
   wherein moving of said film-to-be-poled comprises rotatably moving said film-to-be-poled.

2. The poling treatment method according to claim 1, wherein the poling treatment on said 90° domain is performed at the Curie temperature of said film-to-be-poled, or higher.

3. The poling treatment method according to claim 1, wherein the poling treatment on said 90° domain is performed while cooling said film-to-be-poled from the Curie temperature or higher.

4. The poling treatment method according to claim 1, wherein the intensity of said magnetic field is larger than 1000 G/100 mT.

5. The poling treatment method according to claim 1, wherein said film-to-be-poled is formed on a substrate.

* * * * *